United States Patent
Ullmann et al.

(10) Patent No.: US 9,772,351 B2
(45) Date of Patent: Sep. 26, 2017

(54) PULSED CURRENT SOURCE WITH INTERNAL IMPEDANCE MATCHING

(71) Applicant: QualiTau, Inc., Mountain View, CA (US)

(72) Inventors: Jens Ullmann, San Jose, CA (US); Gedaliahoo Krieger, Rehovot (IL); James Borthwick, Santa Clara, CA (US)

(73) Assignee: QualiTau, Inc., Mountain View, CA (US)

( * ) Notice: Subject to any disclaimer, the term of this patent is extended or adjusted under 35 U.S.C. 154(b) by 0 days.

(21) Appl. No.: 15/345,171

(22) Filed: Nov. 7, 2016

(65) Prior Publication Data

US 2017/0131327 A1    May 11, 2017

Related U.S. Application Data

(63) Continuation-in-part of application No. 14/937,297, filed on Nov. 10, 2015.

(51) Int. Cl.
  *G01R 1/30* (2006.01)
  *H03F 3/45* (2006.01)
  *G01R 31/28* (2006.01)

(52) U.S. Cl.
  CPC .......... *G01R 1/30* (2013.01); *G01R 31/2858* (2013.01); *H03F 3/45475* (2013.01); *H03F 2200/129* (2013.01); *H03F 2203/45526* (2013.01)

(58) Field of Classification Search
  CPC ... G01R 1/30; G01R 31/2858; H03F 3/45475; H03F 2200/129; H03F 2203/45526
  See application file for complete search history.

(56) References Cited

U.S. PATENT DOCUMENTS

| | | |
|---|---|---|
| 5,514,976 A | 5/1996 | Ohmura |
| 6,249,137 B1 | 6/2001 | Krieger et al. |
| 2007/0178854 A1* | 8/2007 | Sutardja .................. 455/116 |
| 2008/0054930 A1 | 3/2008 | Zhao |

FOREIGN PATENT DOCUMENTS

WO    03/016929    2/2003

OTHER PUBLICATIONS

International Search Report dated Feb. 16, 2017 from International Application No. PCT/US2016/060997.
Written Opinion dated Feb. 16, 2017 from International Application No. PCT/US2016/060997.
Ullmann, U.S. Appl. No. 14/937,297, filed Nov. 10, 2015.

* cited by examiner

*Primary Examiner* — David M Gray
*Assistant Examiner* — Michael Harrison
(74) *Attorney, Agent, or Firm* — Beyer Law Group LLP

(57) ABSTRACT

Pulsed current circuitry for electromigration testing of semiconductor integrated circuits and components. The circuit includes a multiplexer that outputs analog voltage pulses, and is capable of generating both bipolar and unipolar voltage pulses. At least one operational amplifier and resistor receive the voltage pulses from the multiplexer and convert the voltage pulses to current pulses. A charge booster circuit is provided for minimizing overshoots and undershoots during transitions between current levels in the test circuit.

16 Claims, 5 Drawing Sheets

PULSED CURRENT SOURCE WITH INTERNAL IMPEDANCE MATCHING

CROSS-REFERENCE TO RELATED APPLICATIONS

This application is a Continuation-in-Part of U.S. application Ser. No. 14/937,297, filed on Nov. 10, 2015, which is herein incorporated by reference in its entirety.

BACKGROUND

The present invention relates generally to circuitry for testing electrical components and circuits. More particularly, the present invention relates to current pulse circuitry for use in electromigration testing of semiconductor integrated circuits and components.

Semiconductor reliability tests require continuous application of electrical stimulus, usually at a controlled temperature ranging from −50° C. to +350° C. based on the specific test parameter (e.g., hot carrier, electromigration, etc.). For electromigration testing in particular, testing using DC current has always been the preferred approach due to its simplicity, built-in conservatism, and relatively low cost. However, advances in process miniaturization have rendered DC tests insufficient, thus making similar testing under pulsed conditions a necessity.

Current pulses are thus often employed in testing electrical components and circuits. An ideal pulsed stimulus should allow flexible control of Pulse-Repetition-Rate, Duty-Cycle, Polarity, and Intensity (Amplitude). These parameters are illustrated in FIGS. 1A and 1B, where T is the period, frequency (f) is the pulse repetition rate (Hz), duty cycle is 2 tp/T; positive amplitude is $A_p$, and negative amplitude is $A_n$ (Volt, Amp). When high repetition rate current pulses are required, for example with pulsed electromigration tests, the desired pulse is typically rectangular. Therefore, the transition between current levels must be abrupt with minimal overshoot to effectively provide the intended current drive at each level. FIGS. 1A and 1B show the transition between current levels for bipolar and unipolar current pulses, respectively. Ideally, the transition from the "DC Level" (frequently "GND") to the required current ("$A_p$" or "$A_n$," or generally "A" for simplicity) is abrupt, as shown in FIGS. 1A and 1B.

In reality, however, such transitions take time and can be too slow to reach the required maximum current level A. An effective technique to achieve current pulses is implemented by using two constant current (DC) sources and charge booster circuit, as described in U.S. Pat. No. 6,249,137 to Krieger et al., entitled "CIRCUIT AND METHOD FOR PULSED RELIABILITY TESTING" and in U.S. Pat. No. 7,049,713 to Cuevas et al., entitled "PULSED CURRENT GENERATOR CIRCUIT WITH CHARGE BOOSTER." However, using this technique has become difficult due to its dependence on discrete and potentially obsolete transistors. In addition, aggressive semiconductor scaling has been pushing down pulse current levels, making it difficult to eliminate pulse overshoots. The relatively large number of discrete components in the circuit, combined with its complex calibration and adjustment, increase manufacturing and maintenance costs. Therefore, it is desirable to provide a high quality pulse current source that can achieve the desired current pulses as well as overcome the limitations discussed above.

SUMMARY

In accordance with an embodiment, a test circuit is provided for applying current pulses to a device under test (DUT). The test circuit includes a multiplexer and at least one operational amplifier and resistor. The multiplexer outputs analog voltage pulses, and is capable of generating both bipolar and unipolar voltage pulses. The at least one operational amplifier and resistor receive the voltage pulses from the multiplexer and convert the voltage pulses to current pulses. An operational amplifier outputs current pulses, and the current pulses are bipolar or unipolar current pulses depending on whether the operational amplifier and resistor receive bipolar or unipolar voltage pulses.

In accordance with another embodiment, a method is provided for providing a pulsed current to a device under test (DUT). A plurality of different voltage levels are provided to a plurality of input terminals of a multiplexer. Voltage pulses are generated from a selected voltage level by using input select combination of input select lines of the multiplexer to determine which of the input terminals of the multiplexer is connected to an output of the multiplexer. Input select combination of the multiplexer is performed by assigning address values to input select lines of the multiplexer in a way such that any transitional address value leads to a monotonic change of the output of the multiplexer, which comprise voltage pulses. The voltage pulses are converted to current pulses using a plurality of resistors, operational amplifiers, and capacitors.

In accordance with yet another embodiment, a single circuit that is capable of providing both unipolar and bipolar current pulses is provided. The circuit includes a multiplexer and at least one operational amplifier and resistor. The multiplexer receives at least one positive voltage signal and at least one negative voltage signal, and the multiplexer is capable of generating both bipolar and unipolar voltage pulses from the voltage signals it receives. The operational amplifier and resistor receive the voltage pulses from the multiplexer and convert the voltage pulses to current pulses. An operational amplifier outputs bipolar or unipolar current pulses depending on whether the at least one operational amplifier and resistor receive bipolar or unipolar voltage pulses.

In accordance with another embodiment, a test circuit is provided for applying current pulses to a device under test (DUT). The test circuit includes a multiplexer, at least one operational amplifier and resistor, and a charge booster circuit for minimizing overshoots and undershoots during transitions between current levels. The multiplexer outputs analog voltage pulses, and the multiplexer is capable of generating both bipolar and unipolar voltage pulses. The operational amplifier and resistor receive the voltage pulses from the multiplexer and convert the voltage pulses to current pulses. The operational amplifier outputs current pulses that are bipolar or unipolar current pulses depending on whether the at least one operational amplifier and resistor receive bipolar or unipolar voltage pulses. The charge booster circuit includes at least one operational amplifier, a plurality of resistors, and a capacitor.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF EMBODIMENTS

The present invention relates generally to testing electrical components and circuits. The embodiments herein describe pulsed current circuitry for electromigration testing of semiconductor integrated circuits and components.

Figure 2:
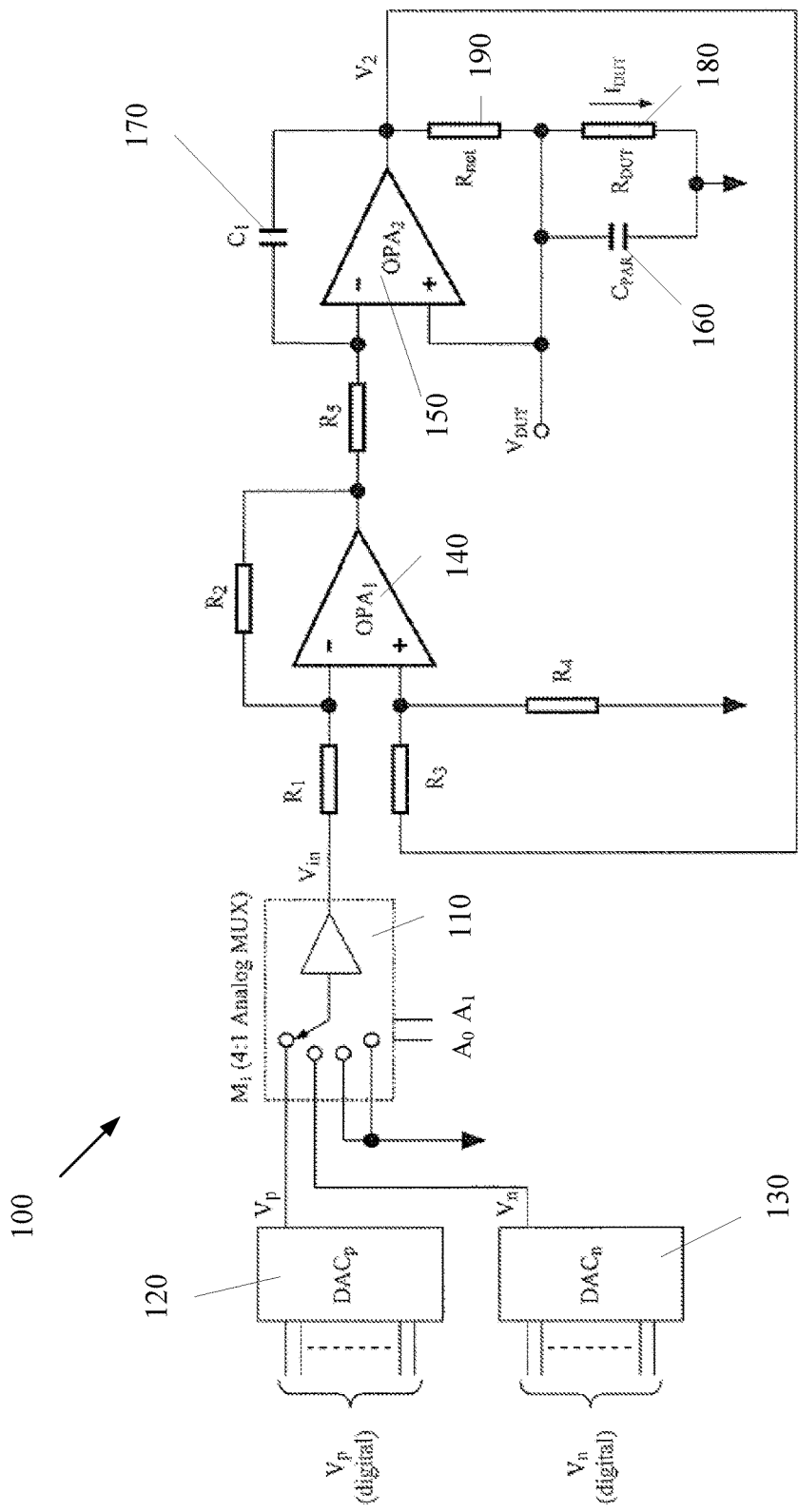
FIG. 2 is a conceptual schematic diagram of pulsed current circuitry in accordance with an embodiment

Referring to FIGS. 2-5, embodiments of pulsed current test circuitry will be described. FIG. 2 is a conceptual schematic diagram of pulsed current test circuitry 100 in accordance with an embodiment. In the illustrated embodiment, the pulsed current test circuitry 100 includes a high-speed analog multiplexer 110. An exemplary multiplexer is the ADV3221/ADV3222 analog multiplexer, which is available commercially from Analog Devices, Inc. of Norwood, Mass. The multiplexer 110 can generate either unipolar or bipolar voltage pulses at repetition rates as high as 10 MHz (40 nS pulse). The rest of the circuit 100 converts these voltage pulses ($V_{in}$) to current pulses ($I_{dut}$) accordingly, using fast operational amplifiers, which function properly at these rates.

The sensitivity of the circuit 100 to common-mode errors is minimized by positioning the device under test (DUT) between ground and the output of the current source. Another advantage is attained by not using a differential amplifier, which is commonly associated with high leakage currents.

$DAC_p$ and $DAC_n$ 130 are digital-to-analog converters that convert a digital voltage signal to an analog voltage signal. The $DAC_p$ 120 and $DAC_n$ 130 provide the required discrete analog voltage levels $V_p$ and $V_n$ to the second and third input terminals of the analog multiplexer $M_1$ 110, respectively. That is, $V_p$ and $V_n$ should be sufficient to drive the desired current through $R_{DUT}$. The first input terminal of the multiplexer $M_1$ 110 is connected to ground voltage GND or to an additional digital-to-analog converter ($DAC_g$) to have control over a desired DC component added to current pulse. In Example 1 below with three voltage levels, the fourth input of the multiplexer $M_1$ 110 is still used and is connected to the first input to achieve monotonic change of output even though only three voltage levels are needed for a bipolar pulse in this example.

Generally, the multiplexer $M_1$ 110 has one less input select line than voltage levels, as shown in the examples below. In Example 1, the two input select lines $A_0$ and $A_1$ determine which of the inputs of the multiplexer $M_1$ 110 is connected to the output of the multiplexer $M_1$ 110 (Vin). As explained herein, the particular connectivity is intentional rather than arbitrary, with the second input connected to the highest maximum voltage ($V_p$ in this example), the first and fourth inputs connected to the intermediate (GND or $DAC_g$, if applicable), and the third input connected to the lowest voltage ($V_n$).

Input select combination of multiplexer $M_1$ 110 by assigning address values to the input select lines $A_0$ and $A_1$ is performed in a way such that any transitional address value always leads to a monotonic, and therefore seamless, change of the output (e.g., high=>low=>lower; low=>high=>higher), with the following example demonstrating it in more detail:

EXAMPLE 1

Bipolar Pulse (Three Voltage Levels)

| $M_1$ Output Voltage | Input Select (Address) | $M_1$ Output Status (Stable/Transitional) |
|---|---|---|
| $V_p$ | $A_0 = 0, A_1 = 1$ | Stable |
| $V_g$ | $A_0 = 0, A_1 = 0$ | Stable |
| $V_g$ | $A_0 = 1, A_1 = 1$ | Transitional |
| $V_n$ | $A_0 = 1, A_1 = 0$ | Stable |

As shown in the example above, only one address line changes during transitions from $V_p$ to $V_g$ and from $V_p$ to $V_g$. However, if a transition from $V_p$ to $V_n$ takes place, assigning the input select as $A_0=1$ and $A_1=1$ as a transitional address of $V_g$ ensures that no matter which address line changes state first—the output voltage of the MUX $M_1$ 110 follows the desired voltage transition monotonically. It will be understood that, in other embodiments, the three-level case described above can be expanded to four- and five-level pulse, with monotonic transitions ensured, using a similar addressing approach with three and four input select lines, respectively, as shown in the examples below.

EXAMPLE 2

Bipolar Pulse (Four Voltage Levels)

| $M_1$ Output Voltage | Input Select (Address) | $M_1$ Output Status (Stable/Transitional) |
|---|---|---|
| $V_1$ (max) | $A_0 = 0, A_1 = 0, A_2 = 1$ | Stable |
| $V_2$ ($V_3 < V_2 < V_1$) | $A_0 = 0, A_1 = 0, A_2 = 0$ | Transitional |
| $V_2$ ($V_3 < V_2 < V_1$) | $A_0 = 0, A_1 = 1, A_2 = 1$ | Transitional |
| $V_2$ ($V_3 < V_2 < V_1$) | $A_0 = 0, A_1 = 1, A_2 = 0$ | Stable |
| $V_3$ ($V_4 < V_3 < V_2$) | $A_0 = 1, A_1 = 1, A_2 = 1$ | Stable |
| $V_3$ ($V_4 < V_3 < V_2$) | $A_0 = 1, A_1 = 1, A_2 = 0$ | Transitional |
| $V_3$ ($V_4 < V_3 < V_2$) | $A_0 = 1, A_1 = 0, A_2 = 1$ | Transitional |
| $V_4$ (min) | $A_0 = 1, A_1 = 0, A_2 = 0$ | Stable |

In Example 2 above, in the transition from $V_1$ to $V_4$, there are two input select lines changing state: $A_2$ from 1 to 0 and $A_0$ from 0 to 1. If $A_2$ transitions before $A_0$, the resulting transitional pattern is 000, which is assigned to $V_2$. If, on the other hand, $A_0$ transitions before $A_2 A_0$, the resulting transitional pattern is 101, which is assigned to $V_3$. Therefore, the resulting voltage change is monotonic while the address pattern is changing.

EXAMPLE 3

Bipolar Pulse (Five Voltage Levels)

| $M_1$ Output Voltage | Input Select (Address) | $M_1$ Output Status (Stable/Transitional) |
|---|---|---|
| $V_1$ (max) | $A_0 = 0, A_1 = 0, A_2 = 1, A_3 = 1$ | Stable |
| $V_2$ ($V_3 < V_2 < V_1$) | $A_0 = 0, A_1 = 0, A_2 = 1, A_3 = 0$ | Transitional |

-continued

| $M_1$ Output Voltage | Input Select (Address) | $M_1$ Output Status (Stable/Transitional) |
|---|---|---|
| $V_2$ ($V_3 < V_2 < V_1$) | $A_0 = 1, A_1 = 0, A_2 = 1, A_3 = 1$ | Transitional |
| $V_2$ ($V_3 < V_2 < V_1$) | $A_0 = 0, A_1 = 0, A_2 = 0, A_3 = 1$ | Stable |
| $V_2$ ($V_3 < V_2 < V_1$) | $A_0 = 0, A_1 = 1, A_2 = 1, A_3 = 1$ | Transitional |
| $V_3$ ($V_4 < V_3 < V_2$) | $A_0 = 1, A_1 = 0, A_2 = 1, A_3 = 0$ | Transitional |
| $V_3$ ($V_4 < V_3 < V_2$) | $A_0 = 0, A_1 = 0, A_2 = 0, A_3 = 1$ | Transitional |
| $V_3$ ($V_4 < V_3 < V_2$) | $A_0 = 1, A_1 = 1, A_2 = 1, A_3 = 1$ | Transitional |
| $V_3$ ($V_4 < V_3 < V_2$) | $A_0 = 0, A_1 = 0, A_2 = 0, A_3 = 0$ | Stable |
| $V_3$ ($V_4 < V_3 < V_2$) | $A_0 = 0, A_1 = 1, A_2 = 1, A_3 = 0$ | Transitional |
| $V_3$ ($V_4 < V_3 < V_2$) | $A_0 = 1, A_1 = 0, A_2 = 0, A_3 = 0$ | Transitional |
| $V_4$ ($V_5 < V_4 < V_3$) | $A_0 = 1, A_1 = 0, A_2 = 0, A_3 = 0$ | Transitional |
| $V_4$ ($V_5 < V_4 < V_3$) | $A_0 = 1, A_1 = 1, A_2 = 0, A_3 = 1$ | Transitional |
| $V_4$ ($V_5 < V_4 < V_3$) | $A_0 = 0, A_1 = 1, A_2 = 0, A_3 = 0$ | Stable |
| $V_4$ ($V_5 < V_4 < V_3$) | $A_0 = 1, A_1 = 1, A_2 = 1, A_3 = 0$ | Transitional |
| $V_5$ (min) | $A_0 = 1, A_1 = 1, A_2 = 0, A_3 = 0$ | Stable |

Thus, as shown above, with every change of a single address line, the next voltage is selected. For example, transitioning from $V_2$ to $V_5$, the voltages $V_3$, $V_4$, and $V_5$ will always be selected in that order (i.e., monotonic changes), with no gaps or duplicate voltage selections.

Figures 1A, 1B:
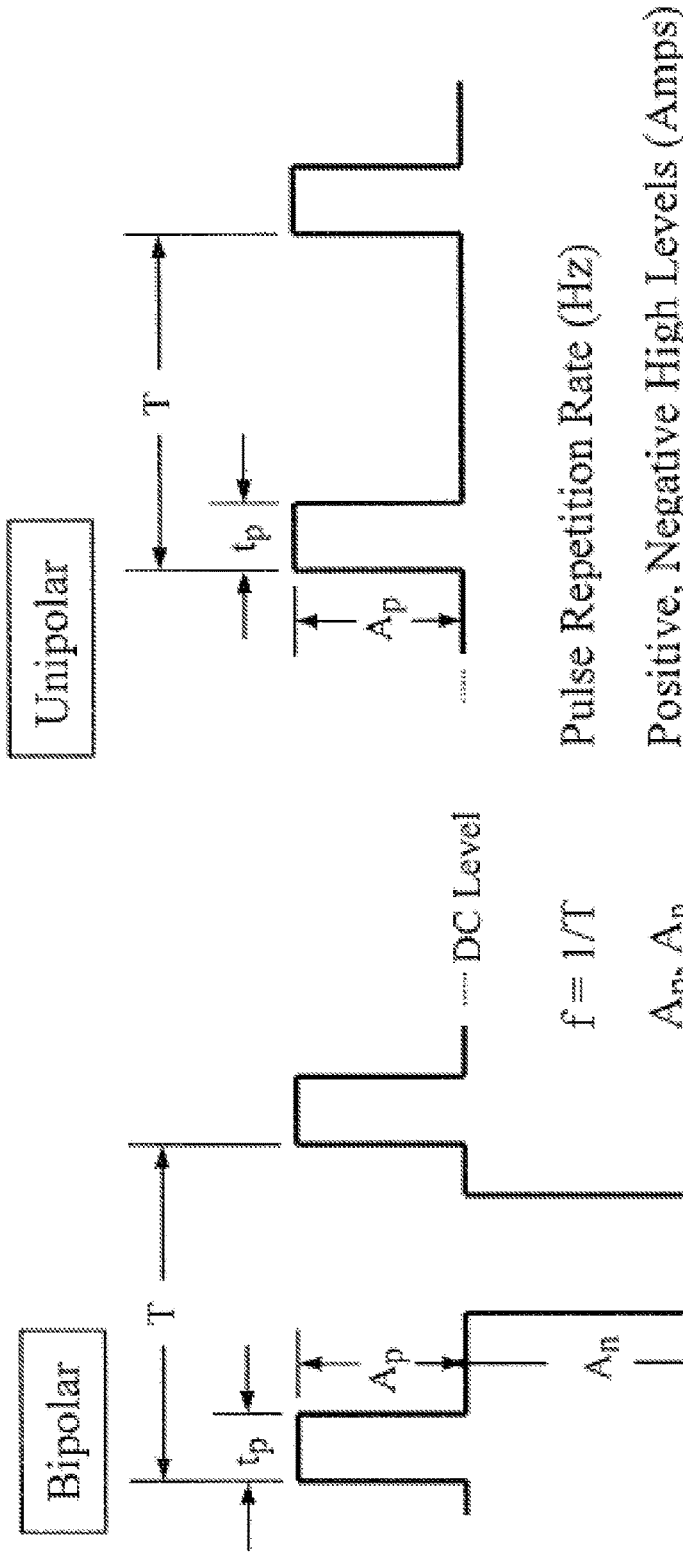
FIGS. 1A and 1B illustrate bipolar pulses and unipolar pulses, respectively, that are useful in testing electronic components.

Assuming that the parasitic capacitance $C_{par}$ 160 and capacitor $C_1$ 170 are very small ($R_5 * C_1$ is less than one percent of $T_p$ or $T_n$; and $R_n * C_{par}$ is less than one percent of $T_p$ or $T_n$), their charging and discharging will take much less time than $t_p$ and $t_n$ (FIG. 1). Given that, the current $I_{DUT}$ flowing through $R_{DUT}$ 180 is the same as the current flowing through $R_{net}$ 190, and the following relation is valid:

$$(V_{DUT} + I_{DUT} R_{net}) \left( \frac{R_4}{R_3 + R_4} \right) - V_{off}^1 = \frac{V_{DUT} - V_{off}^2 - V_{in}}{R_1 + R_2} R_1 + V_{in} \quad (1)$$

where $V_{off}^1$ and $V_{off}^2$ are the offset voltages of the operational amplifiers $OPA_1$ 140 and $OPA_2$ 150, respectively. It will be understood that input bias currents are ignored because they are too small to have any significant effect on the circuit 100.

Combining and arranging terms in equation (1) above yields:

$$V_{DUT} \left( \frac{R_1}{R_1 + R_2} - \frac{R_4}{R_3 + R_4} \right) + V_{in} \frac{R_2}{R_1 + R_2} - V_{off}^2 \frac{R_1}{R_1 + R_2} + V_{off}^1 = = I_{DUT} R_{net} \frac{R_4}{R_3 + R_4} \quad (2)$$

By setting R1=KR2 and R3=KR4 (with K being a constant that is subject to modification), the terms having $V_{DUT}$ cancel and equation (2) can be simplified to:

$$\frac{V_{in}}{K+1} - \frac{KV_{off}^2}{K+1} + V_{off}^1 = \frac{KI_{DUT} R_{net}}{K+1} \quad (3)$$

and $$I_{DUT} = \frac{V_{in}}{KR_{net}} + \frac{(K+1)V_{off}^1 - KV_{off}^2}{KR_{net}} = \frac{V_{in}}{KR_{net}} + \delta \quad (4)$$

where $V_{in} = V_p$ for the "high" part of the pulse and $V_{in} = V_n$ for the "low" part of the pulse, and $$\delta \equiv \frac{(K+1)V_{off}^1 - KV_{off}^2}{KR_{net}}$$

Apart from the error introduced by the offset voltages, the required current pulse is attained by setting $DAC_p$ and $DAC_n$ to $V_p = I_p R_{net}$ and $V_n = R_{net}$, respectively. To assess the accuracy of the current source, the worst case error $\delta_{max}$ is defined as:

$$\delta_{max} \equiv \text{Max} \left\{ \frac{|(K+1)V_{off}^1| + |KV_{off}^2|}{KR_{net}} \right\} \leq \frac{(2 + 1/K)|V_{off}(\text{max})|}{R_{net}}$$

where $V_{off}(\text{max})$ is the largest possible offset value of ($V_{off}^1$, $V_{off}^2$,) under the entire operating range (mainly temperature). The ratio between the maximum error and the desirable current provides a conservative gauge of accuracy for the pulsed current source:

$$\text{Max Relative Error} \leq \pm \frac{(2 + 1/K)|V_{off}(\text{max})|}{|V_{DUT}|} \quad (5)$$

This relative error can be a limitation for low currents. However, measurements are typically carried out in a controlled environment, where the ambient temperature varies only by a few degrees relative to the set room temperature. This enables nearly complete elimination of the error, using calibration, pre-test offset measurement, and common correction algorithms.

The circuit will not be complete as long as capacitors $C_1$ and $C_{par}$ are restricted to very low values. For $C_1$, which is connected to suppress high-frequency oscillations, it is not a real limitation because it functions effectively by increasing the pulse rise and fall times by a few nanoseconds only.

$C_{par}$, on the other hand, poses a real challenge as its total value can reach 50 pF or more (combination of the packaged DUT, printed circuit board capacitance, and layout). For example, with $R_{DUT}$=1kΩ and $C_{par}$=50 pF, the resulting time constant $R_{DUT} C_{par}$ is 50 nS (5×10$^{-8}$ seconds), making low current pulses shorter than 250 nS practically impossible.

Figure 3:
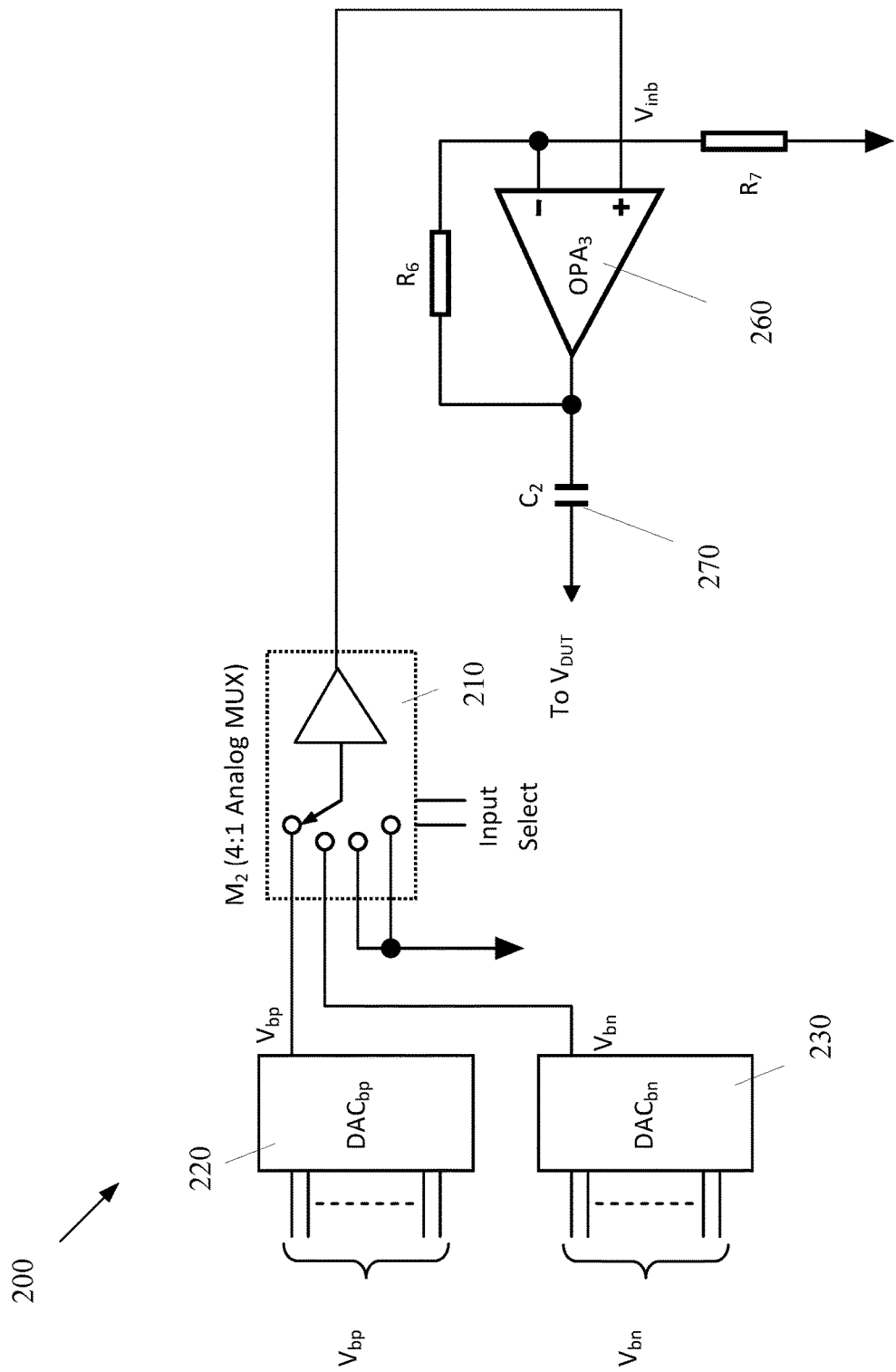
FIG. 3 is a conceptual schematic diagram of a charge booster circuit in accordance with an embodiment.

The solution involves a separate charge booster. Unlike U.S. Pat. No. 6,249,137, which uses discrete (and potentially obsolete) transistors and a relatively complex circuitry, according to an embodiment, a charge booster circuit 200, as shown in FIG. 3, is provided. This approach is based on the "balanced-attenuator" concept, which aims at eliminating overshoots and undershoots during abrupt changes, such as rise and fall of a pulse. As discussed in more detail below, the charge booster circuit 200 has input voltage signals $V_{bp}$ and $V_{bn}$, which are converted from digital to analog signals by two DACs ($DAC_{bp}$ 220 and $DAC_{bn}$ 230), and the charge booster circuit 200 returns its output signal to the top of $R_{DUT}$ (marked as "$V_{DUT}$" in FIG. 2). Similar to $OPA_1$ 140 and $OPA_2$ 150 (FIG. 2), operational amplifier $OPA_3$ 260 in the charge booster circuit 200 is sufficiently fast to function properly at the required pulse repetition rates.

Figure 4:
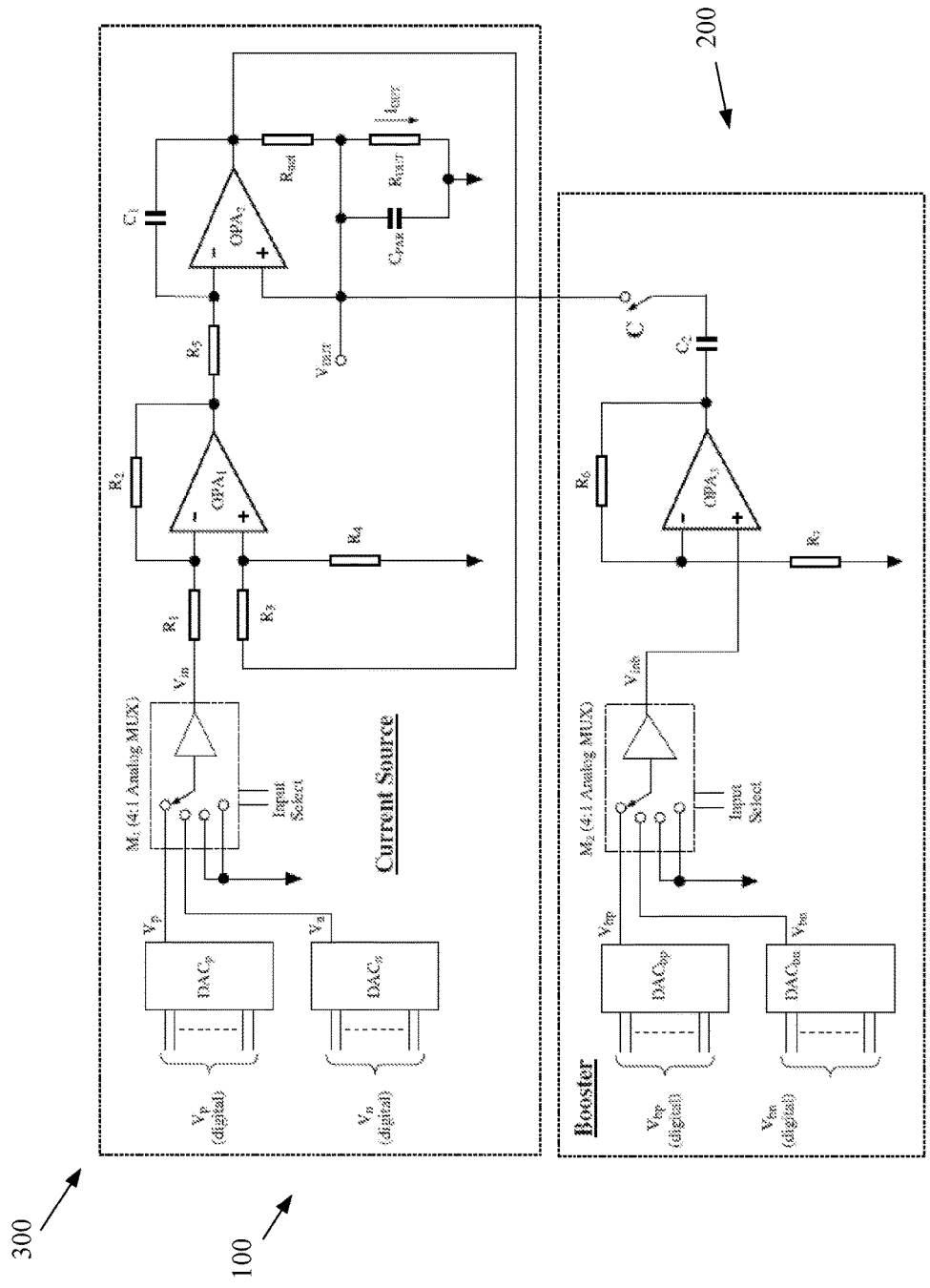
FIG. 4 is a conceptual schematic diagram of a pulsed current circuit and a charge booster circuit, in accordance with an embodiment.

As shown in FIG. 3, the charge booster circuit 200 is driven by a combination of two DACs ($DAC_{bp}$ 220 and $DAC_{bn}$ 230) and a 4:1 Analog Multiplexer ($M_2$) 210, similar to the conceptual current source shown in FIG. 2. The same input select lines are used for both $M_1$ 110 and $M_2$ 210, but the two pairs of DACs (120, 130 and 220, 230) are independent, meaning that the input signal to the inverting input of $OPA_L$ 140 ($V_{in}$) and the input signal to the non-inverting input of $OPA_3$ 260 ($V_{inb}$) are synchronized but their voltage levels are independent. The output voltage of the charge booster circuit 200 (i.e. the output of $OPA_3$ 260) is coupled to the DUT ($V_{DUT}$) via capacitor $C_2$ 270, as shown in FIG. 4.

Denoting the time just following a rise or fall (transition) of the pulse t=0⁺ and neglecting the offset voltage and input currents of $OPA_2$ 150 and $OPA_3$ 260, the current through capacitors $C_2$ 270 and $C_{par}$ 160 just after the transition satisfies the following relation:

$$V_{DUT}^{0+} - V_{DUT}^{0-} = (V_{bp} - V_{bn})\left(1 + \frac{R_6}{R_7}\right)\left(\frac{C_2}{C_2 + C_{par}}\right) \quad (6)$$

Once the transition is complete (t>0⁺), the current flows only through the resistors, according to equation (4) above. Neglecting the offsets and imposing the equality between the change in DUT voltage according to equation (6) and the difference between the two "steady" DUT levels according to equation (4), Equation (7a) represents the transition from low(n) to high (p) and Equation (7b) represents the transition from high (p) to low (n):

$$\frac{V_p - V_n}{KR_{net}} R_{DUT} = (V_{bp} - V_{bn})\left(1 + \frac{R_6}{R_7}\right)\left(\frac{C_2}{C_2 + C_{par}}\right) \quad (7a)$$

$$\frac{V_n - V_p}{KR_{net}} R_{DUT} = (V_{bn} - V_{bp})\left(1 + \frac{R_6}{R_7}\right)\left(\frac{C_2}{C_2 + C_{par}}\right) \quad (7b)$$

Equations (7a) and (7b) are similar to the basic (passive) balanced attenuator condition, where the transition is dominated by charge distribution via capacitive coupling, while the "steady state" is determined by the current flowing through $R_{DUT}$ from the current source. The values of K, $R_6$, $R_7$, and $C_2$ are optimized for the best circuit performance in terms of maximum speed, minimum noise, and best stability. An embodiment of a combined circuit 300 (current source 100 and booster 200) is shown in FIG. 4.

Figure 5:
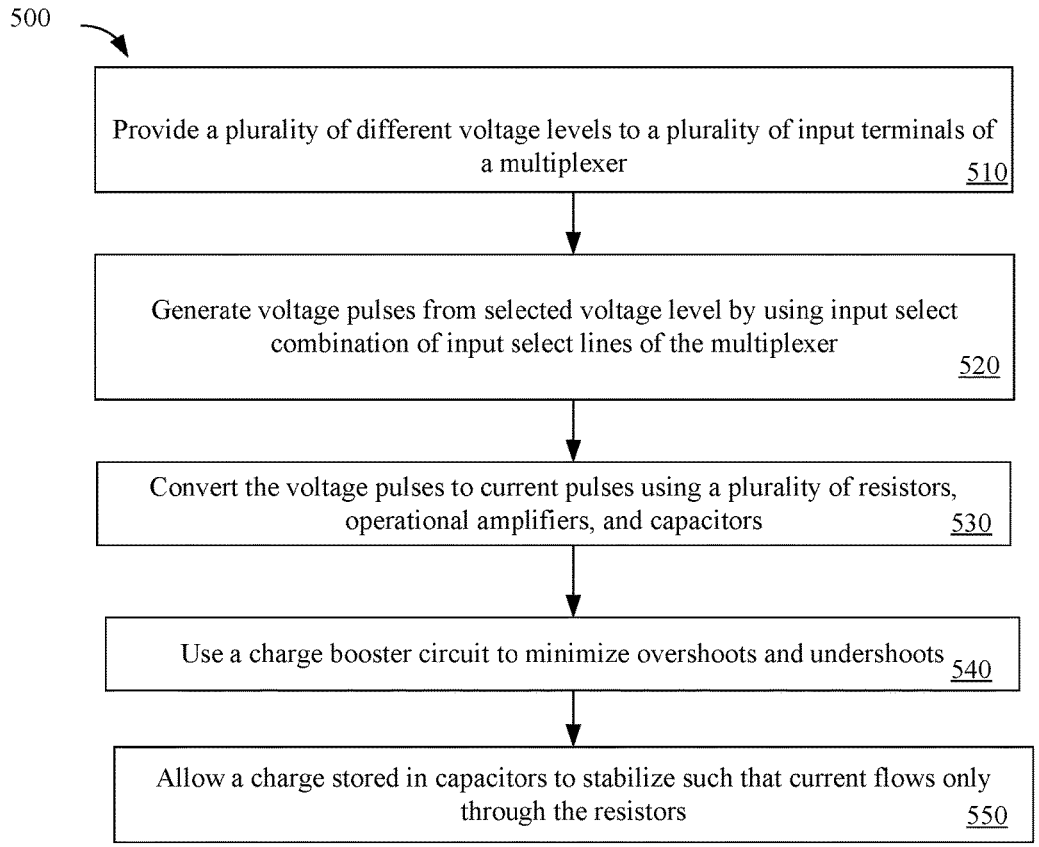
FIG. 5 is a flow chart of a method of providing a pulsed current to a device under test (DUT).

FIG. 5 is a flow chart of a method 500 of providing a pulsed current to a device under test (DUT). In Step 510, a plurality of different voltage levels is provided by DACs to a plurality of input terminals of a multiplexer in pulsed current test circuit. In Step 520, voltage pulses are generated from a selected voltage level by using input select combination of input select lines of the multiplexer to determine which of the input terminals of the multiplexer is connected to an output of the multiplexer. The input select combination of the multiplexer is performed in a way that any transitional address value for the multiplexer leads to a monotonic change of the output of the multiplexer, and voltage pulses are the output of the multiplexer. The voltage pulses are then converted to current pulses using a plurality of resistors, operational amplifiers, and capacitors in Step 530. The method 500 can further include Steps 540 and 550. In Step 540, a charge booster circuit connected to the pulsed current test circuit is used to minimize overshoots and undershoots during transitions between current levels. The charge booster circuit is driven by a combination of two DACs, which provide a plurality of different voltage levels to a plurality of input terminals of a multiplexer in the charge booster circuit, which further includes an operational amplifier, a plurality of resistors, and a capacitor. The signal to the inverting input of the operation amplifier of the pulsed current test circuit and the input signal to the non-inverting input of the operational amplifier in the charge booster circuit are synchronized but their voltage levels are independent because both multiplexers are fed from the same input select lines, but the two pairs of DACs (one pair in the pulsed current test circuit and the other pair in the charge booster circuit) are independent. In Step 550, a charge stored in the capacitor is allowed to stabilize such that current flows only through resistors.

A real-time computer can be used to control the circuitry described herein. According to an embodiment, the first step is setting the current source to DC levels $I_p$ and $I_n$, by setting $DAC_p$ to $V_p$ and $DAC_n$ to $V_n$, and fixing the input select terminals of the analog multiplexers $M_1$ and $M_2$ accordingly—all while the booster switch is open (i.e. disconnecting the booster from the DUT). The resulting DC voltage levels ($V_{DUT}$ driven by $V_p$ and $V_n$) are then acquired from their respective peak detectors and stored for reference (hereunder "$V_{pdc}$" and "$V_{ndc}$"). Next, $DAC_{bp}$ is set to a sufficiently lower level than required and $DAC_{bn}$ is set to a sufficiently higher level than required, assuring undershoots rather than overshoots. $S_1$ is then engaged and the input select terminals of $M_1$ and $M_2$ are activated with the required waveform. Following that, the peak detectors readings are acquired ($V_{pp}$, $V_{nn}$) and compared with $V_{pdc}$ and $V_{pdc}$, respectively. In the likely case of $|V_{pp}|<|V_{pdc}|$ and $|V_{nn}|<|V_{ndc}|$, more boosting is needed. Increasing the boosting action is attained by varying $V_{bp}$ and $V_{bn}$ until the resulting peak detectors readings just exceed $V_{pdc}$ and $V_{ndc}$, respectively. At this point the boosting action is decreased incrementally and the process is repeated in a converging manner to the point where any further change has a negligible effect. For sufficiently long pulses $V_{DUT}$ will gradually "converge" to the proper levels $V_{pdc}$ and $V_{ndc}$, even without boosting; however, as the related time constant is longer than short pulses (typically for pulse width <500 nS), such "convergence" provides little help and efficient boosting is therefore necessary. Note that the actual algorithm used for the above iterations (i.e. increasing and decreasing boosting action) is not related to the invention, as it is a matter of efficient convergence. In reality, various algorithms such as binary search (when applicable) are effective, but the invention is not limited to one particular algorithm or another.

Although only a few embodiments have been described in detail, it should be appreciated that the invention may be implemented in many other forms without departing from the scope of the invention. In view of all of the foregoing, it should be apparent that the present embodiments are illustrative and not restrictive and the invention is not limited to the details given herein, but may be modified within the scope and equivalents of the appended claims.

What is claimed is:

1. A test circuit for applying current pulses to a device under test (DUT), the test circuit comprising:
    a first multiplexer that outputs analog voltage pulses, the first multiplexer being capable of outputting both bipolar and unipolar voltage pulses; and
    at least one operational amplifier and resistor that receive the voltage pulses from the first multiplexer and convert the voltage pulses to current pulses, wherein an operational amplifier outputs current pulses, wherein the current pulses are bipolar or unipolar current pulses depending on whether the at least one operational amplifier and resistor receive bipolar or unipolar voltage pulses, wherein the first multiplexer has one less input select line than voltage levels provided to its input terminals, wherein the first multiplexer has three voltage levels provided to four input terminals, and wherein an intermediate voltage level is selected with a transitional address for an input select combination of the first multiplexer, wherein the input select combination comprises address values assigned to the input select lines.

2. The test circuit of claim 1, further comprising a charge booster circuit for minimizing overshoots and undershoots during transitions between current levels, wherein the charge booster circuit comprises at least one operational amplifier and a plurality of resistors.

3. The test circuit of claim 2, wherein the charge booster circuit receives voltage pulses from a second multiplexer, wherein the voltage pulses from the second multiplexer are synchronized with but independent from the voltage pulses received from the first multiplexer and the charge booster circuit delivers its output to the DUT, wherein the DUT is positioned between ground and the output of the current pulses.

4. The test circuit of claim 3, wherein the first and second multiplexers have the same input select lines.

5. The test circuit of claim 1, wherein only one input select address line changes during a transition from highest voltage to intermediate voltage or from lowest voltage to intermediate voltage.

6. The test circuit of claim 1, wherein the multiplexer generates an analog signal from discrete voltages.

7. The test circuit of claim 1, wherein at least two operational amplifiers and five resistors receive the voltage pulses from the first multiplexer and convert the voltage pulses to current pulses.

8. A method of providing a pulsed current to a device under test (DUT), the method comprising:
providing a plurality of different voltage levels to a plurality of input terminals of a first multiplexer;
generating voltage pulses from a selected voltage level by using input select combination of input select lines of the first multiplexer to determine which of the input terminals of the first multiplexer is connected to an output of the first multiplexer, wherein input select combination of the first multiplexer is performed by assigning address values to input select lines of the first multiplexer in a way such that any transitional address value leads to a monotonic change of the output of the first multiplexer, wherein the output of the first multiplexer comprises voltage pulses; and
converting the voltage pulses to current pulses using a plurality of resistors, operational amplifiers, and capacitors.

9. The method of claim 8, wherein converting further comprises:
using a charge booster circuit to minimize overshoots and undershoots, the charge booster circuit comprising an operational amplifier, a plurality of resistors, and a capacitor.

10. The method of claim 9, wherein using the charge booster circuit comprises providing a second multiplexer that receives a plurality of voltage levels independent from the voltage levels provided to the first multiplexer.

11. The method of claim 10, wherein using the charge booster circuit further comprises allowing a charge stored in the capacitor to stabilize such that current flows only through resistors.

12. A single circuit capable of providing both unipolar and bipolar current pulses, the circuit comprising:
a multiplexer that receives at least one positive voltage signal and at least one negative voltage signal, wherein the multiplexer is capable of outputting both bipolar and unipolar voltage pulses from the voltage signals it receives; and
at least one operational amplifier and resistor that receive the voltage pulses from the multiplexer and convert the voltage pulses to current pulses, wherein an operational amplifier outputs bipolar or unipolar current pulses depending on whether the at least one operational amplifier and resistor receive bipolar or unipolar voltage pulses,
wherein the first multiplexer has one less input select line than voltage levels provided to its input terminals,
wherein the first multiplexer has three voltage levels provided to four input terminals, and
wherein an intermediate voltage level is selected with a transitional address for an input select combination of the first multiplexer, wherein the input select combination comprises address values assigned to the input select lines.

13. The circuit of claim 12, wherein at least two operational amplifiers and five resistors that receive the voltage pulses from the multiplexer and convert the voltage pulses to current pulses.

14. A test circuit for applying current pulses to a device under test (DUT), the test circuit comprising:
a first multiplexer that outputs analog voltage pulses, the first multiplexer being capable of outputting both bipolar and unipolar voltage pulses;
at least one operational amplifier and resistor that receive the voltage pulses from the first multiplexer and convert the voltage pulses to current pulses, wherein an operational amplifier outputs current pulses, wherein the current pulses are bipolar or unipolar current pulses depending on whether the at least one operational amplifier and resistor receive bipolar or unipolar voltage pulses; and
a charge booster circuit for minimizing overshoots and undershoots during transitions between current levels, wherein the charge booster circuit comprises at least one operational amplifier, a plurality of resistors, and a capacitor,
wherein the first multiplexer has one less input select line than voltage levels provided to its input terminals,
wherein the first multiplexer has three voltage levels provided to four input terminals, and
wherein an intermediate voltage level is selected with a transitional address for an input combination of the first multiplexer, wherein the input select combination comprises address values assigned to the input select lines.

15. The test circuit of claim 14, wherein the charge booster circuit further comprises a second multiplexer receives a voltage signal and outputs voltage pulses, wherein the first and second multiplexers have the same input select lines.

16. The test circuit of claim 14, wherein the output of the charge booster circuit is delivered to the DUT.

* * * * *